(12) United States Patent
Kaburlasos (10) Patent No.: US 7,903,495 B2
(45) Date of Patent: Mar. 8, 2011

(54) SELECTIVELY CONTROLLED MEMORY

(75) Inventor: Nikos Kaburlasos, Lincoln, CA (US)

(73) Assignee: Intel Corporation, Santa Clara, CA (US)

( * ) Notice: Subject to any disclaimer, the term of this patent is extended or adjusted under 35 U.S.C. 154(b) by 402 days.

(21) Appl. No.: 12/059,640

(22) Filed: Mar. 31, 2008

(65) Prior Publication Data

US 2009/0245007 A1 Oct. 1, 2009

(51) Int. Cl.
*G11C 5/14* (2006.01)
(52) U.S. Cl. .......................... 365/229; 365/226; 365/227
(58) Field of Classification Search .................. 365/226, 365/227, 228, 229
See application file for complete search history.

(56) References Cited

U.S. PATENT DOCUMENTS

| 7,626,852 | B2* | 12/2009 | Houston | 365/154 |
| 2006/0200597 | A1* | 9/2006 | Christenson et al. | 710/57 |
| 2007/0156995 | A1 | 7/2007 | Kaburlasos | |
| 2008/0126816 | A1* | 5/2008 | Prete et al. | 713/323 |
| 2008/0177940 | A1* | 7/2008 | Risse | 711/105 |
| 2009/0021989 | A1* | 1/2009 | Rashed et al. | 365/189.09 |

* cited by examiner

*Primary Examiner* — Hoai V Ho
*Assistant Examiner* — Jay Radke
(74) *Attorney, Agent, or Firm* — Schwabe, Williamson & Wyatt, P.C.

(57) ABSTRACT

Embodiments of methods, apparatuses, and systems that enable power conservation in data buffering components are disclosed. Other embodiments may also be disclosed.

17 Claims, 5 Drawing Sheets

SELECTIVELY CONTROLLED MEMORY

TECHNICAL FIELD

Embodiments of the disclosure relate to the field of electronics, and, more specifically, to providing a memory buffer that can be selectively powered to reduce power leakage.

BACKGROUND

Typically, in electronic systems, a processor or processing logic may retrieve data or a data structure from system memory over a high-speed and consequently high-power input/output ("I/O") interface. After processing, the data may be output over a slower and lower power I/O interface. To reduce power dissipation, these systems typically employ buffers, such as first-in, first-out ("FIFO") buffers. The buffers stage the data while it is consumed by the processor and output over the slower I/O interface. The buffers facilitate power conservation by allowing the high-power I/O interface to quickly output a portion of the data or data structure from system memory and power down until another portion of data is required.

The amount of time that the high-power I/O interface is powered down, thereby dissipating less power, may be related to various characteristics of the system, for example, the size of the buffer. Increasing the size of the buffer in order to power down the high-speed I/O interface for longer periods of time, however, has typically been avoided. As the size of the memory buffer increases, there is a similar increase in leakage power. This may result from the entire memory buffer receiving a single operational power level. Those memory banks which are not in use (e.g. not being accessed) dissipate an equivalent amount of power compared to the memory banks which are currently in use. Consequently, any power savings achieved by powering down the I/O interface for longer periods of time are typically offset by the additional leakage power dissipated by the increased size of the memory buffer.

BRIEF DESCRIPTION OF THE DRAWINGS

Embodiments of the present disclosure will be readily understood by the following detailed description in conjunction with the accompanying drawings. Embodiments of the disclosure are illustrated by way of example and not by way of limitation in the figures of the accompanying drawings.

DETAILED DESCRIPTION OF EMBODIMENTS

In the following detailed description, reference is made to the accompanying drawings which form a part hereof, and in which are shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete operations in turn, in a manner that may be helpful in understanding embodiments; however, the order of description should not be construed to imply that these operations are order dependent or that every operation is necessary to practice the various embodiments.

The description may use perspective-based descriptions such as up/down, back/front, and top/bottom. Such descriptions are merely used to facilitate the discussion and are not intended to restrict the application of the various embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

For the purposes of the description, a phrase in the form "A/B" or in the form "A and/or B" means (A), (B), or (A and B). For the purposes of the description, a phrase in the form "at least one of A, B, and C" means (A), (B), (C), (A and B), (A and C), (B and C), or (A, B and C). For the purposes of the description, a phrase in the form "(A)B" means (B) or (AB) that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

In various embodiments, methods, apparatuses, and systems for power efficient data retrieval and processing are provided. In exemplary embodiments of the present disclosure, a computing system may be endowed with one or more components of the disclosed apparatuses and/or systems and may be employed to perform one or more methods as disclosed herein.

Embodiments of the present disclosure may facilitate power conservation in data buffering systems by avoiding power leakage in memory components. In exemplary embodiments, a memory may be partitioned into a plurality of memory banks. Each of the plurality of memory banks may be configured to be independently and selectively powered, and therefore, configured to operate in various system states relative to the other memory banks (e.g. an operational state or a retention state). In various embodiments, this may include the plurality of memory banks being configured to receive varying power levels. Through the use of various system states, the leakage power of the memory buffer may be reduced. Additionally, because the leakage power of the memory buffer may be effectively reduced, larger memory buffers may be utilized to extend the amount of time various high power components may be powered down. This may also reduce system power dissipation.

Figure 1:
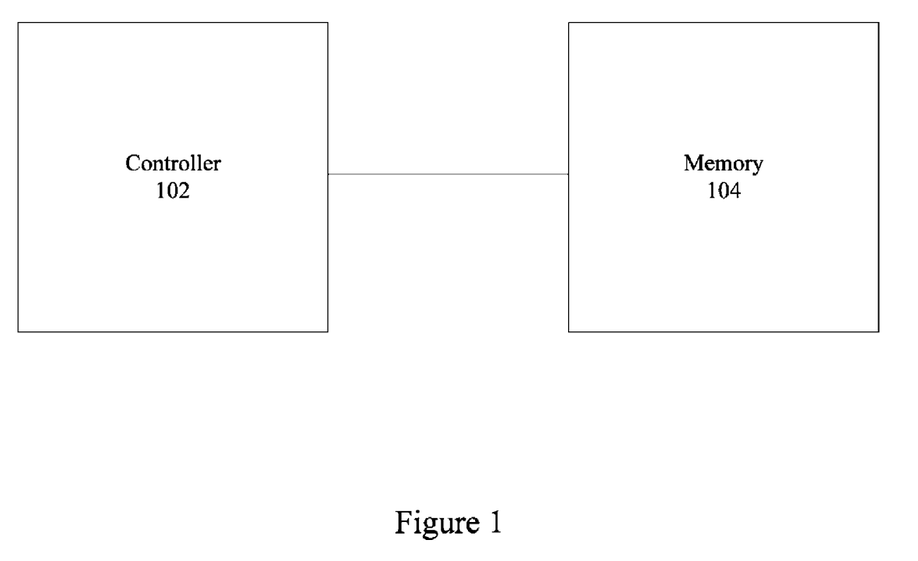
FIG. 1 illustrates a block diagram of an apparatus in accordance with various embodiments.

Referring to FIG. 1, a block diagram of an apparatus is illustrated in accordance with various embodiments. In the illustrated embodiment, a controller 102 may be coupled to a memory 104. The controller 102 may be any type of controller known or to be used in the art such as, but not limited to, a microcontroller, a memory controller, a central processing unit ("CPU") or any other general purpose processor. In various embodiments, memory 104 may include various types of computer readable media including both volatile and non-volatile memory. For example, memory 104 may be a volatile memory such as, but not limited to, dynamic random access memory ("DRAM"), static random access memory ("SRAM"), or content addressable memory. In other embodiments, memory 104 may be any component or components suitable for use to buffer data. The disclosure is not to be limited in this regard.

While illustrated as separate components, it is to be understood that controller 102 and memory 104 may provided on a single integrated circuit, for example as a CPU. Alternatively, the various components may be disposed within separate packages and provided, for example, as a chipset. The disclosure is not to be limited in this regard.

Figure 2:
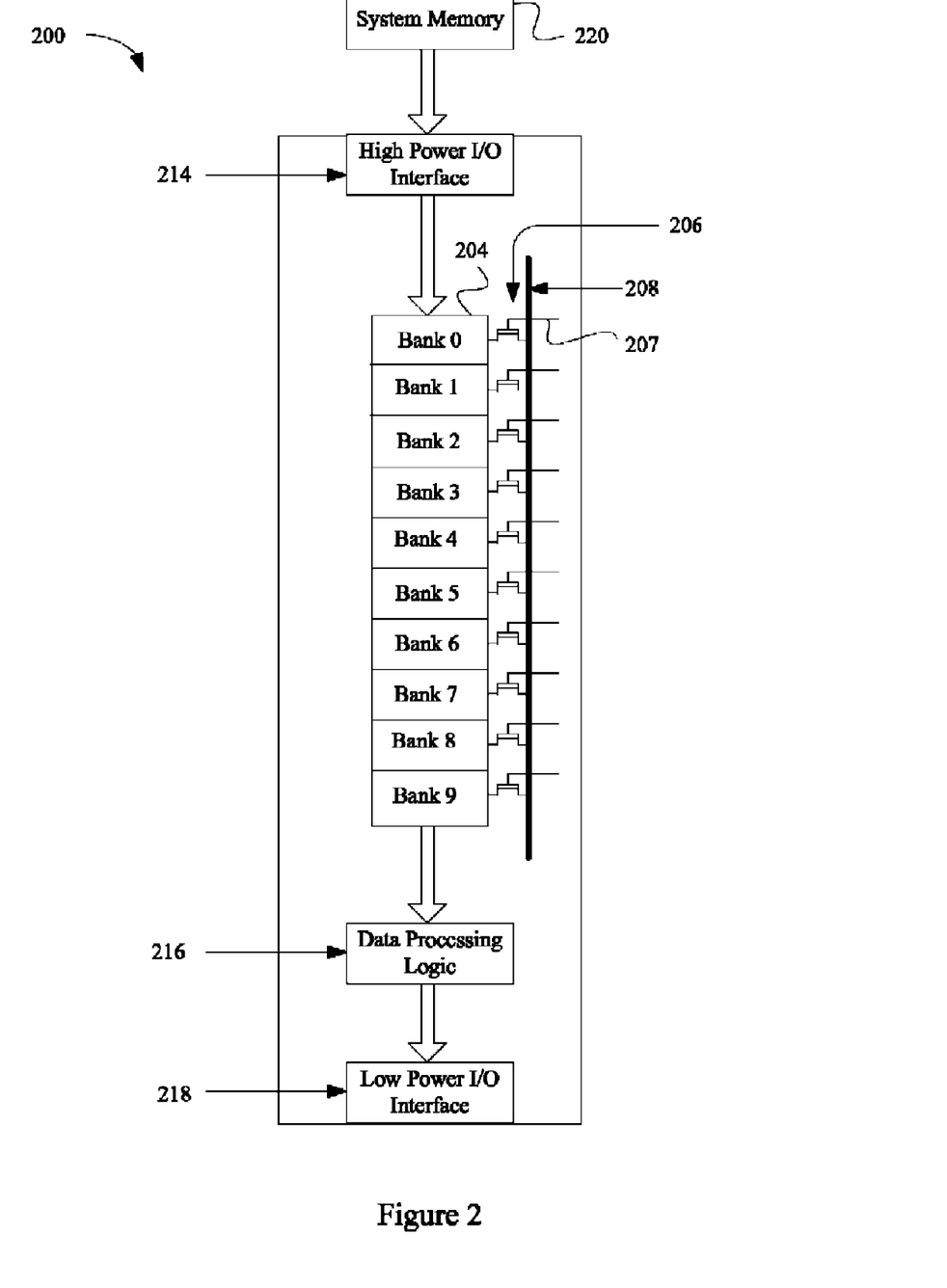
FIG. 2 illustrates a diagram of an apparatus in accordance with various embodiments.

Referring to FIG. 2, a block diagram of an embodiment of the apparatus is illustrated. The apparatus, in various embodiments, may include a memory 204 partitioned into a plurality of memory banks (illustrated as banks 0-9) configured to be independently powered, a plurality of voltage adaptor components 206 configured to receive signals from a controller over inputs 207, and a power rail 208 to provide power to each of the memory banks 0-9.

The power rail 208, in various embodiments, may be associated with a system state of the apparatus. For example, the power rail may be associated with an access state in which each of the plurality of memory banks coupled to the power rail may be accessible (e.g. written to or read from). Alternatively, the power rail may be associated with a holding state in which the plurality of memory banks coupled to the power rail may not be accessible, but retain their data. The power rail may supply signals, power, current, and/or voltages to the plurality of memory banks 0-9. In various embodiments, the power rail may be coupled to other components, such as a power supply, to supply the signals, and/or power, and/or current, and/or voltages associated with each of the system states.

The voltage adaptor components 206, in various embodiments, may be correspondingly coupled to the plurality of memory banks and configured to receive signals from the controller to enable one or more of the plurality of voltage adaptor components to provide either a first voltage or a second voltage to a corresponding memory bank. The voltage adaptor components may include components configured to convey and/or adapt a voltage supplied from a power rail 208. While other voltage adaptor components and/or circuits are contemplated, such as voltage regulators, in at least one embodiment, the voltage adaptor components 206 may be sleep transistors. In the embodiment, a sleep transistor may couple its corresponding memory bank to a power rail 208. The sleep transistor 206 may receive signals, such as a bank select signal, from a controller via input 207 to enable it to provide either a first voltage or a second voltage to its corresponding memory bank.

In various embodiments, providing the first voltage may include conveying the voltage supplied by the power rail 208 to the memory bank to facilitate accessing the memory bank. In another embodiment, providing the second voltage may include adapting the first voltage to the second voltage via voltage adaptor component 206. More specifically, in various embodiments, upon receipt of a signal from a controller, the voltage adaptor component 206 may adapt (e.g. lower) the first voltage to provide the second voltage by creating a voltage drop across the voltage adaptor component 206. Consequently, in various embodiments, the first voltage may be higher than the second voltage. In various embodiments, the second voltage may enable the memory bank to maintain the data stored therein. The second voltage, however, may not enable all of the functionality associated with the first voltage, such as, for example, the ability to access the memory bank. In various embodiments, the first voltage may be an operational voltage, and the second voltage may be a retention voltage.

Still referring to FIG. 2, various other components are illustrated, for example: a system memory 220, a high-power I/O interface 214, data processing logic 216, and a low power I/O interface 218. Those of ordinary skill in the art will readily understand that more or fewer components may be utilized in conjunction with this disclosure.

In various embodiments, system memory 220 may include data to be processed by a processor. The memory 204 may be partitioned into a plurality of memory banks and may be configured to buffer the input data from the high-power I/O interface 214. In various embodiments, the memory 204 may also have a memory capacity configured for a particular application. In one embodiment, the memory 204 may be a display data buffer and be sized to retain an entire data structure from system memory (e.g. 5-6 MB). In various other embodiments, the memory buffer 204 may be other sizes; the disclosure is not to be limited in this regard.

In various embodiments, to load the memory buffer 204, a controller may selectively control a voltage supplied to one or more of the plurality of memory banks to enable a selected one of the memory banks to receive a first voltage or a second voltage. In various embodiments, the controller may selectively control the voltage by transmitting signals to one or more of the voltage adaptor components 206. The signals may indicate to the voltage adaptor components to provide a first voltage (e.g. an operational voltage) to enable the plurality of memory banks to be accessed. In various embodiments, providing the first voltage may comprise conveying a voltage from power rail 208. In the embodiment, all of the memory banks may be provided with the first voltage simultaneously, thereby allowing the high power I/O interface to output the data from system memory into the memory buffer 204.

In other embodiments, a controller may selectively provide voltages to one or more of the memory banks 0-9 to enable the data from system memory 220 to be loaded. In this embodiment, a controller may transmit a signal to a voltage adaptor component associated with memory bank 0, for example, to provide a first voltage. The first voltage may enable memory bank 0 to be accessed. Concurrently, a controller may transmit signals to the remaining voltage adaptor components associated with corresponding memory banks 1-9 to provide a second voltage, the second voltage being lower than the first voltage. When memory bank 0 reaches its memory capacity, the controller may transmit a signal to the voltage adaptor component 206 associated with memory bank 1 (e.g. the next sequential memory bank) to transition memory bank 1 from the second voltage to the first voltage (e.g. from the retention voltage to the operational voltage). This may enable memory bank 1 to be accessed. In various embodiments, the remaining memory banks may either transition to or remain at the second voltage. In this manner, the controller may reduce leakage power during a loading phase of the memory buffer 204.

In various embodiments, with the data from system memory 220 output to the memory buffer 204, a controller may power down various components. For example, a controller may place the system memory in a low power mode, power down the high-power I/O interface, and power down various internal buses. Various other components which are not illustrated may also be powered down. The disclosure is not to be limited in this regard.

Data processing logic 216 may then process the data in memory buffer 204 and output the data over a low power I/O interface 218, in accordance with various embodiments. Data may be retrieved from the memory buffer 204, for processing, by sequentially providing either a first voltage or a second voltage to the individual memory banks 0-9 of memory 204. For example, in one embodiment, a controller may provide a first voltage (e.g. an operational voltage) to memory bank 0 to enable memory bank 0 to be accessed. The remaining memory banks 1-9 may receive a second voltage (e.g. a retention voltage) which is lower than the first voltage. In this manner, memory bank 0 may be accessed, while memory banks 1-9 receive a voltage which does not allow them to be accessed, but enables them to maintain their data. When the data from memory bank 0 has been consumed, a controller may transition another memory bank, for example, memory bank 1 to the first voltage. Additionally, a controller may transition memory bank 0 to the second voltage and maintain the other memory banks 2-9 at the second voltage. A controller may sequentially control voltages to each of the memory banks to enable the data to be retrieved and processed by data processing logic 216. In this manner, data may be retrieved and processed at expected data rates while reducing leakage power.

In another embodiment, a controller may selectively power a first memory bank at a first voltage, and simultaneously begin to transition a second memory bank from the second voltage to the first voltage. This may enable the second memory bank to be in an accessible state when the data from the first memory bank has been processed. In this manner, there may be a single active memory bank and a single waking memory bank at a single point in time. Those of ordinary skill in the art will readily understand that other embodiments are possible without deviating from the teachings of the disclosure.

In various embodiments, when the data buffer in system memory needs to be fetched again, for example, when the memory gets updated, the memory 204 may receive data output from the high-speed I/O interface while it is being accessed by the processing logic 216. For example, a controller may provide a first voltage to memory bank 7 to enable the data in memory bank 7 to be accessed by processing logic 216. Concurrently, a controller may provide a first voltage to memory bank 0 to enable the high power I/O interface to output data to memory bank 0. In this manner, various memory banks may be sequentially accessed to be loaded with data or alternatively to provide the data to a data processing logic 216. In various other embodiments, a controller may provide the entire memory 204 with a first voltage to enable the memory 204 to receive the entire data buffer from system memory simultaneously.

Figure 3:
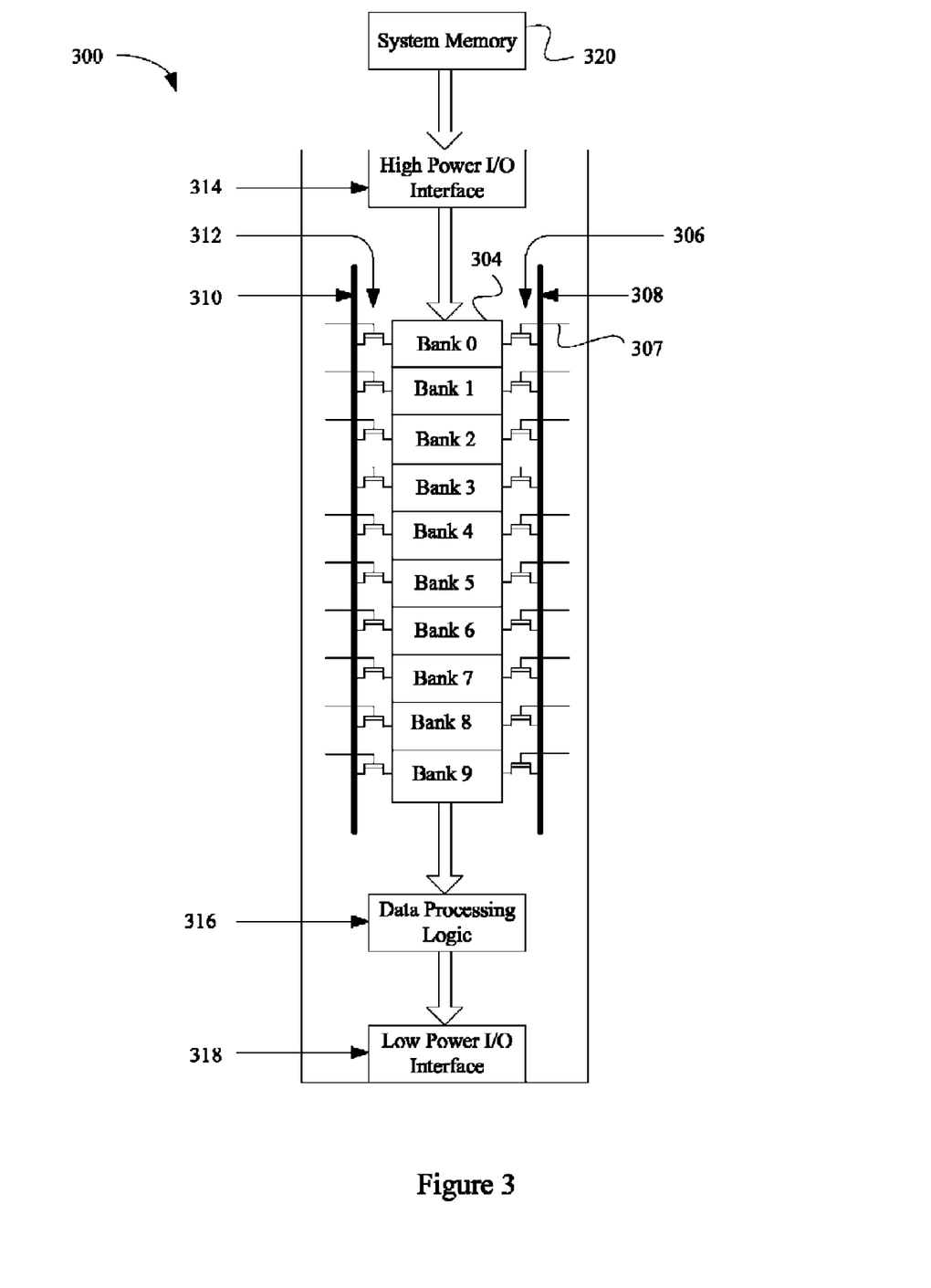
FIG. 3 illustrates a diagram of an apparatus in accordance with various embodiments.

Referring now to FIG. 3, an apparatus in accordance with another embodiment of the disclosure is illustrated. The apparatus of FIG. 3 may include generally similar components to those discussed above with reference to FIG. 2. Additionally, the apparatus may also include a second power rail 310, coupling components 312 having inputs 307. The inputs 307 may be configured to receive signals from a controller indicating a power level to be provided to each of the corresponding memory banks of memory 304. In various embodiments, depending upon the power level to be provided, either of the coupling components for a respective memory bank may be active. In various embodiments, the memory may be a FIFO buffer having a size capable of buffering an entire data buffer transferred out of system memory.

In various embodiments, power rail 308 and power rail 310 may each provide a different voltage. For example, power rail 308 may provide a first voltage and power rail 310 may provide a second voltage. The first power rail 308 may be an operational power rail 308 that is configured to provide a first voltage corresponding to an operational voltage. The operation voltage, in various embodiments, may enable a memory bank to be accessible (e.g. written to or read from). The operational power rail may, for example, supply 0.8 volts to corresponding memory banks. The second power rail 310 may be a retention power rail 310 that is configured to provide a second voltage corresponding to a retention voltage. In various embodiments, the retention voltage may be lower than the operational voltage. The retention power rail 310 may supply enough power to enable a memory bank to retain its data, but not to operate normally (e.g. be accessed). In various embodiments, this power rail may provide 0.6 volts. In various embodiments, by coupling a memory bank to the operational power rail 308 when access is required, and to the retention power rail 310 when access is not required, power may be reduced to memory banks that are not being accessed.

In various other embodiments, more power rails may be included. For example, in one embodiment, the apparatus may include a third power rail to supply a third voltage. The third voltage may be different than both the first and the second voltages supplied by the first and second power rails, respectively. In the embodiment, the third power rail may be associated with a turbo system state in which the voltage supplied is higher than both the first and the second voltages. In various embodiments, the third voltage may enable the memory 304 to operate at higher clock speeds.

In various embodiments, a memory buffer 304 may be increased in size so that the memory buffer 304 may hold most or all of a data buffer from system memory 320. The memory buffer 304 may be partitioned into a number of memory banks, wherein each memory bank is configured to be independently powered by, for example, being coupled to either the operational power rail 308 or the retention power rail 310 via coupling components 306 and 312, respectively. In various embodiments, only one of the two coupling components 306 or 312 may be enabled at any one time. The coupling components 306, 312 may be configured to convey the voltage from their respective power rail to the corresponding memory bank when enabled.

In various embodiments, data may be stored in memory 304 as mentioned previously. More specifically, data may be fetched over the high-power I/O interface 314 from system memory 320, and placed in the memory buffer 304. In one embodiment, a controller may transmit a signal to coupling components 306 and 312 to enable each of the memory banks to be coupled to the operational power rail 308. In this manner, more than one memory bank 0-9 may be accessible simultaneously. The high-power I/O interface may then output the data to memory banks 0-9.

Alternatively, in other embodiments, a controller may selectively power one or more of the plurality of memory banks 0-9 to enable only the one or more memory banks being accessed to be coupled to the operational power rail 308. In the embodiment, the remaining memory banks that are not being accessed may be coupled to the retention power rail 310. A controller may then sequentially couple memory banks of memory 304 to the operational power rail to enable memory to be output by the high power I/O interface 314 without experiencing a data transfer penalty. In this manner leakage power may be reduced.

In various embodiments, data within memory 304 may be accessed in a similar selective manner. In one embodiment, all but two of the memory banks 0-9 may be connected to the retention power rail 310 and dissipate low leakage power. In this embodiment, all memory banks which are coupled to the retention power rail 310 may not have their data read out, but may retain their data. A single "active" memory bank may be coupled to the operational power rail 308, and the data stored in the corresponding memory bank may be consumed or processed by data processing logic 316. In various embodiments, another memory bank (e.g. a "waking" memory bank) may be transitioned from the retention power rail 310 to the operational power rail 308. In various embodiments, by the time the data stored in the active memory bank has been consumed the waking memory bank may have completed its transition to the operational power rail 308. Consequently, the waking memory bank may become the next active memory bank. In the embodiment, the coupling components associated with the previously active memory bank may be reprogrammed so the corresponding memory bank (e.g. the previously active memory bank) switches to the retention rail 310. In this manner, a controller may selectively provide power to the memory banks 0-9 and effectively reduce leakage power.

In various embodiments, transitioning various memory banks to operational power rails prior to the memory banks being accessed may enable the data to be transferred to the processing logic 316 with no performance penalty. In other words the sequential switching of power rails may be transparent to the processing logic.

While various embodiments have been described, those of ordinary skill in the art will understand that other methods may be utilized. For example, a waking memory bank may not be utilized. This may result in a performance penalty because more time will be required to transition various memory banks from the retention rail to the operational rail, but may also result in power savings because the high power I/O interface may be powered down for longer periods of time. Those of ordinary skill in the art will readily understand other methodologies are possible.

In various other embodiments, data may be loaded into memory buffer 304 while data is being transferred out of memory buffer 304. For example, rather than one memory bank (e.g. memory banks 0-9) being coupled to the operational power rail 308, and one memory bank transitioning to the operational power rail 308, two memory banks may be coupled to the operational power rail 308 and two memory banks may be transitioning to the operational power rail 308. In various embodiments, one memory bank on the operational power rail 308 may receive data output by the high power I/O interface 314 while the other memory bank on the operational power rail 308 may output data to the processing logic 316. The two transitioning memory banks may be the next sequential memory banks either written to, or read from.

Figure 4:
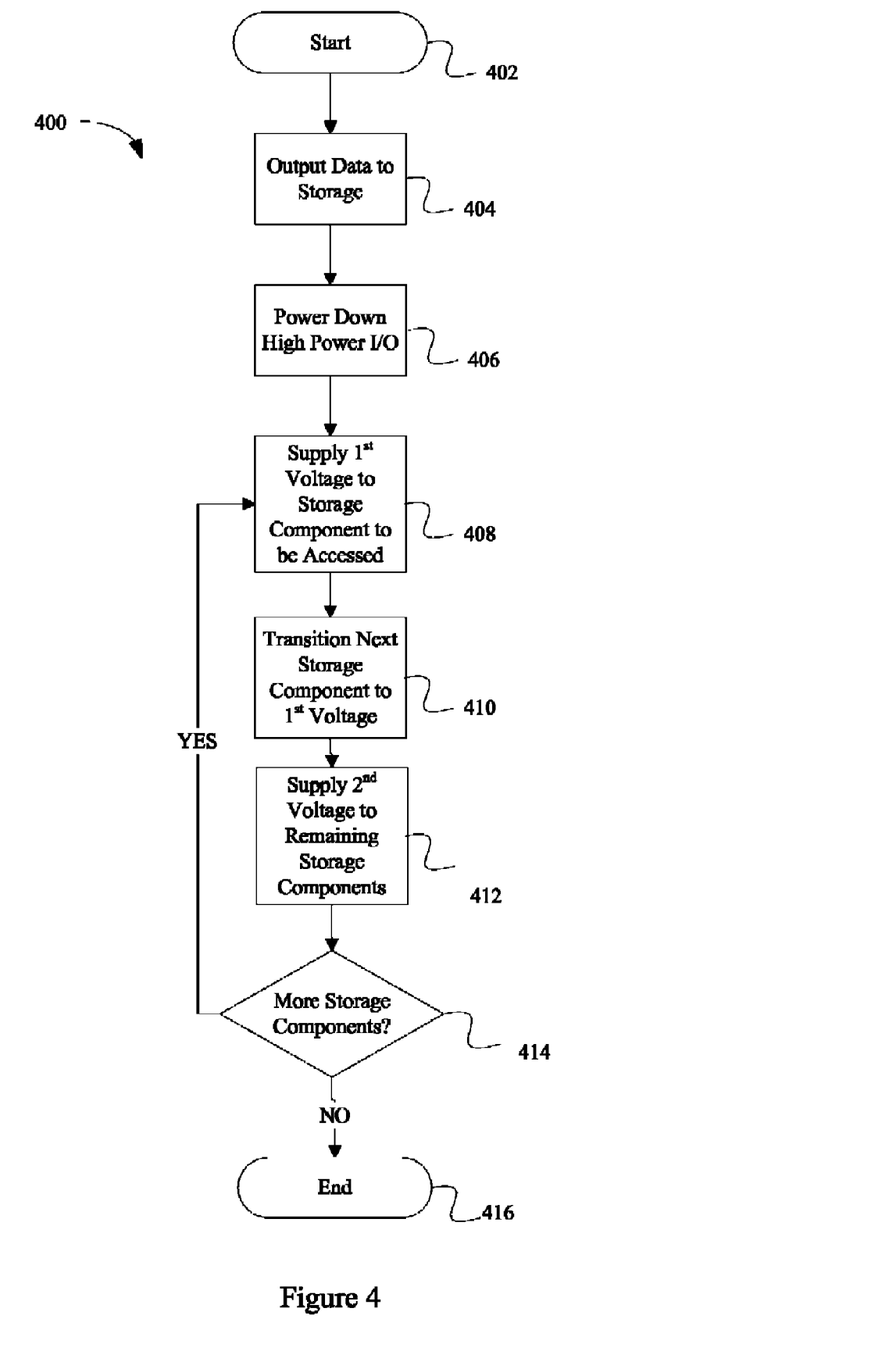
FIG. 4 illustrates a flow diagram suitable for use to practice a method in accordance with various embodiments.

Referring now to FIG. 4, a flow diagram suitable for use to practice a method in accordance with various embodiments is illustrated. Describing the methods by reference to a flow diagram may enable one skilled in the art to develop a program, including instructions to carry out the methods on suitably configured platforms. In various embodiments, the computer readable instructions may be written in a computer programming language.

The various embodiments are not described with reference to any particular programming language. It will be appreciated that a variety of programming languages may be used to implement the teachings of the embodiments as described herein. Furthermore, it is common in the art to speak of software in one form or another (e.g., program, procedure, process, application, etc.) as taking an action or causing a result. Such expressions are merely a shorthand way of saying that execution of the software by a network device causes the processor of the computer to perform an action or produce a result.

With reference to FIG. 4, a method of sequentially accessing a plurality of storage components may be illustrated. The method may begin at block 402 and progress to block 404 where data from system memory or another memory may be output to a storage. In various embodiments, data may be output to the storage by powering all of the associated storage components at an accessibility voltage level. The accessibility voltage level may enable access to each of the storage components. A high speed I/O interface may then write to each of the storage components in sequential order. In this manner the storage may be utilized as a first-in, first-out ("FIFO") buffer. Alternatively, a controller may sequentially provide an accessibility voltage to each storage component of the storage as the particular storage component is to be accessed. The controller may provide another voltage to the remaining storage components. In various embodiments, the voltage provided to the remaining storage components may be a retention voltage that is lower than the accessibility voltage. This may reduce the leakage power of the storage.

After the data has been effectively stored within the storage, various components may be powered down to conserve power at block 406. For example, a high power I/O interface may be powered down. Additionally, in various other embodiments, system memory and various internal buses may also be powered down. The disclosure is not to be limited in this regard.

With various components powered down, the method may progress to block 408 where a controller may supply an accessibility voltage to a first storage component of the plurality of storage components configured to retain the buffered data. In various embodiments, the accessibility voltage may enable the first storage component to be accessed. In various embodiments, a controller may provide a signal to one or more voltage adaptor components or coupling components. The signal may instruct the voltage adaptor component or coupling component to convey a first voltage from a first power rail.

At block 410, in various embodiments, a next storage component may be transitioned from a second voltage to a first voltage. In various embodiments, the second voltage may be a retention voltage and the first voltage may be an accessibility voltage. In this manner, a second storage component may become a waking storage component. The waking storage component, in various embodiments, may be the next sequential storage component to be accessed. In various embodiments, transitioning a storage component from a second voltage to a first voltage may entail switching the respective storage component from a retention power rail to an accessibility power rail. In this embodiment, a controller may provide signals to voltage adaptor components or coupling components to facilitate transitioning from one power rail to another. In other embodiments, transitioning a storage component from a second voltage to a first voltage may include providing a voltage adaptor component with a signal indicating it may convey a voltage from a power rail without generating a voltage drop across the voltage adaptor component.

At block 412, a controller may supply a retention voltage to one or more of the remaining storage components. The retention voltage may enable the one or more storage components to retain the buffered data while being below the accessibility voltage necessary to access the one or more storage components. Progressing to block 414 a decision is made whether more storage components need to be accessed. If more storage components need to be accessed, the method may loop back to block 408 where a first voltage may be supplied. In various embodiments, the first voltage may be supplied to the storage component that was previously transitioned from the second voltage to the first voltage (e.g. the waking storage component). At block 410 another storage component may be transitioned from the second voltage to the first voltage to be the next storage component to be accessed.

Progressing to block 412, in various embodiments, the remaining storage components may be supplied a second voltage which may be a retention voltage. In various embodiments, supplying the second voltage to the remaining storage components may include supplying the second voltage to the storage components that have been previously accessed. For example, a previously accessed storage component may be transitioned from the first voltage (e.g. the accessibility voltage) to a second voltage (e.g. the retention voltage). This may facilitate a reduction in leakage power. At block 414, if there are no more storage components that need to be accessed, the method may progress to block 416 and end.

While FIG. 4 is described with reference to only two voltages (e.g. an accessibility voltage and a retention voltage), the disclosure is not so limited. For example, a third voltage may be provided to the storage components in which the third voltage is higher than the first and second voltages. In this manner various other system states may be enabled. Furthermore, those of ordinary skill in the art will readily understand that FIG. 4 is one of many methodologies that may be utilized in conjunction with the teachings of the disclosure. Therefore, FIG. 4 is not to be viewed in a limiting sense. Additionally, those of ordinary skill in the art will understand that various blocks within FIG. 4 may be carried out concurrently. For example, blocks 408, 410, and 412 may be performed at substantially the same time. FIG. 4 is not to be construed as requiring any temporal restrictions.

Figure 5:
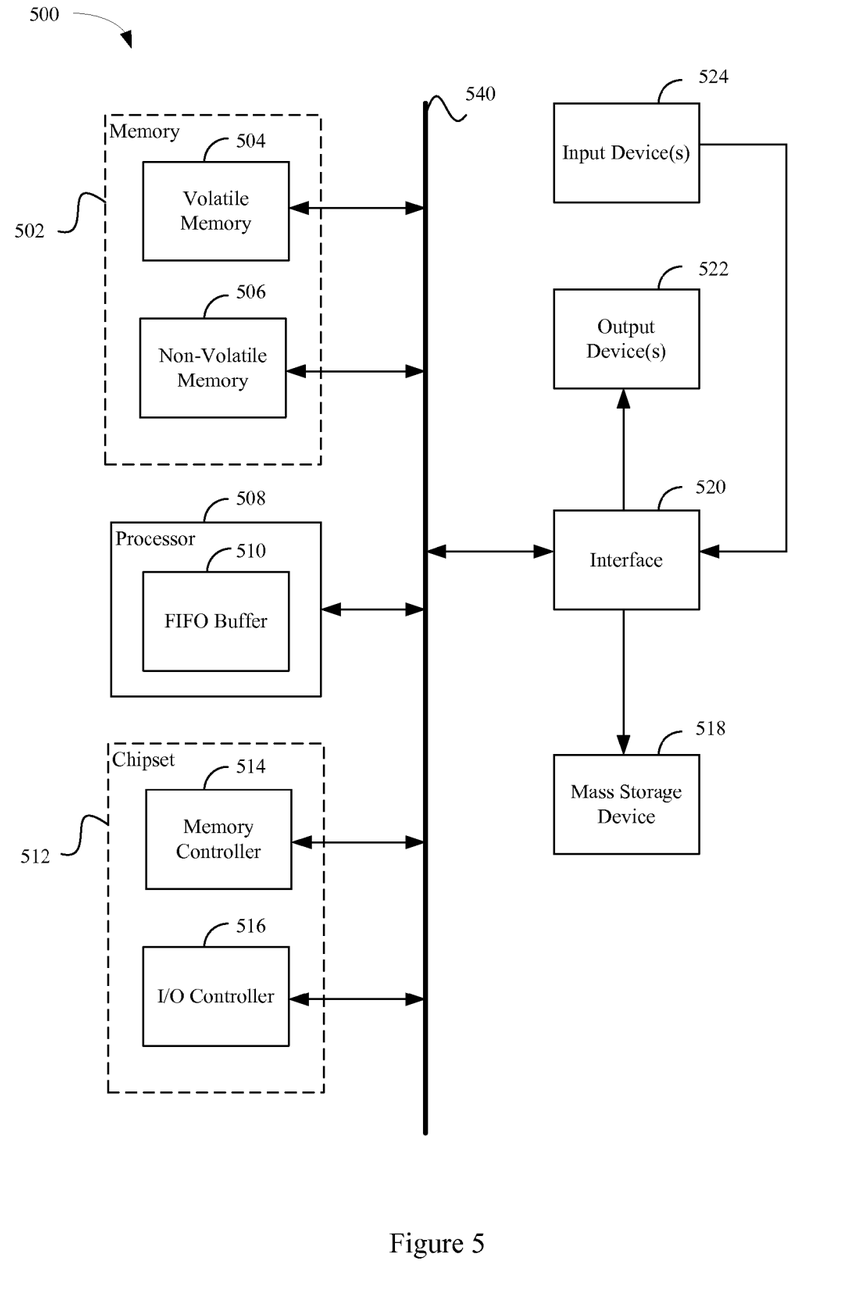
FIG. 5 illustrates a block diagram representation of an example system in accordance with various embodiments.

FIG. 5 is a block diagram of an example processor system 500 adapted to implement the methods and apparatus disclosed herein. The processor system 500 may be a desktop computer, a laptop computer, a handheld computer, a tablet computer, a PDA, a server, an Internet appliance, and/or any other type of computing device.

The processor system 500 illustrated in FIG. 5 includes a chipset 512, which includes a memory controller 514 and an input/output (I/O) controller 516. The chipset 512 may provide memory and I/O management functions as well as a plurality of general purpose and/or special purpose registers, timers, etc. that are accessible or used by a processor 508. In various embodiments, chipset 512 may include a FIFO buffer similar to those discussed above with reference to the various figures. The processor 508 may be implemented using one or more processors, WLAN components, WMAN components, WWAN components, and/or other suitable processing components. The processor 508 may include a FIFO buffer 510 as discussed previously with reference to the various figures. In various embodiments, the FIFO buffer may be powered in various operational states such as an access state or a hold state. The various operational states may be associated with various power rails including a first power rail to provide an access voltage and a second power rail to provide a hold voltage. Additionally, processor 508 may include a cache (not illustrated), which may be implemented using a first-level unified cache (L1), a second-level unified cache (L2), a third-level unified cache (L3), and/or any other suitable structures to store data.

The memory controller 514 may perform functions that enable the processor 508 to access and communicate with a main memory 502 including a volatile memory 504 and a non-volatile memory 506 via a bus 540. The volatile memory 504 may be implemented by Synchronous Dynamic Random Access Memory (SDRAM), Dynamic Random Access Memory (DRAM), RAMBUS Dynamic Random Access Memory (RDRAM), and/or any other type of random access memory device. The non-volatile memory 506 may be implemented using flash memory, Read Only Memory (ROM), Electrically Erasable Programmable Read Only Memory (EEPROM), and/or any other desired type of memory device.

The processor system 500 may also include an interface circuit 520 that is coupled to the bus 540. The interface circuit 520 may be implemented using any type of interface standard such as an Ethernet interface, a universal serial bus (USB), a third generation input/output interface (3GIO) interface, and/or any other suitable type of interface.

One or more input devices 524 may be connected to the interface circuit 520. The input device(s) 524 permit an individual to enter data and commands into the processor 508. For example, the input device(s) 524 may be implemented by a keyboard, a mouse, a touch-sensitive display, a track pad, a track ball, an isopoint, and/or a voice recognition system.

One or more output devices 522 may also be connected to the interface circuit 520. For example, the output device(s) 522 may be implemented by display devices (e.g., a light emitting display (LED), a liquid crystal display (LCD), a cathode ray tube (CRT) display, a printer and/or speakers). The interface circuit 520 may include, among other things, a graphics driver card.

The processor system 500 may also include one or more mass storage devices 518 to store software and data. Examples of such mass storage device(s) 518 include floppy disks and drives, hard disk drives, compact disks and drives, and digital versatile disks (DVD) and drives.

The interface circuit 520 may also include a communication device (not illustrated) such as a modem or a network interface card to facilitate exchange of data with external computers via a network. The communication link between the processor system 500 and the network may be any type of network connection such as an Ethernet connection, a digital subscriber line (DSL), a telephone line, a cellular telephone system, a coaxial cable, etc.

Access to the input device(s) 524, the output device(s) 522, the mass storage device(s) 518 and/or the network may be controlled by the I/O controller 516. In particular, the I/O controller 516 may perform functions that enable the processor 508 to communicate with the input device(s) 524, the output device(s) 522, the mass storage device(s) 518 and/or the network via the bus 540 and the interface circuit 520.

While the components shown in FIG. 5 are depicted as separate blocks within the processor system 500, the functions performed by some of these blocks may be integrated within a single semiconductor circuit or may be implemented using two or more separate integrated circuits. For example, although the memory controller 512 and the I/O controller 516 are depicted as separate blocks within the chipset 512, the memory controller 514 and the I/O controller 516 may be integrated within a single semiconductor circuit.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope of the present disclosure. Those with skill in the art will readily appreciate that embodiments in accordance with the present disclosure may be implemented in a very wide variety of ways. This application is intended to cover any adaptations or variations of the embodiments discussed herein. Therefore, it is manifestly intended that embodiments in accordance with the present disclosure be limited only by the claims and the equivalents thereof.

What is claimed is:

1. An apparatus comprising:
a memory to buffer input data from an input/output interface, the memory being partitioned into a plurality of memory banks wherein the plurality of memory banks are configured to receive varying power levels; and
a controller to selectively control a voltage supplied to the plurality of memory banks to enable a first memory bank of the plurality of memory banks to receive a first voltage to facilitate accessing the first memory bank, a second memory bank of the plurality of memory banks to receive a second voltage to maintain data stored in the second memory bank, and a third memory bank of the plurality of memory banks to receive a third voltage that is higher than the first voltage and the second voltage.

2. The apparatus of claim 1, further comprising:
a plurality of voltage adaptor components coupled to the plurality of memory banks, the plurality of voltage adaptor components being configured to receive signals from the controller to provide the first voltage, the second voltage, or the third voltage to of the first memory bank, the second memory bank, and the third memory bank.

3. The apparatus of claim 2, wherein the first voltage is an operational voltage to facilitate accessing the first memory bank and the second voltage is a retention voltage lower than the operational voltage to allow retention of data within the second memory bank.

4. The apparatus of claim 2, wherein the plurality of voltage adaptor components are coupled to a power rail configured to provide the first voltage; and
the voltage adaptor components are further configured to lower the first voltage supplied by the power rail to supply the second voltage.

5. The apparatus of claim 1, further comprising:
a first power rail to supply the first voltage and a second power rail to supply the second voltage; and
wherein the controller is configured to selectively couple either the first power rail or the second power rail to the plurality of memory banks.

6. The apparatus of claim 5, further comprising a coupling device to selectively couple the first power rail or the second power rail, under the control of the controller, to the plurality of memory banks.

7. The apparatus of claim 1, wherein the memory is a FIFO buffer having a size capable of buffering an entire data buffer transferred out of system memory.

8. A method comprising:
supplying an accessibility voltage to a first storage component of a plurality of storage components configured to retain buffered data, the accessibility voltage to enable the first storage component to be accessed;
supplying a retention voltage to a second storage component of the plurality of storage components, the retention voltage to enable the second storage component to retain the buffered data and being below the accessibility voltage to access the second storage component; and
supplying another voltage to a third storage component of the plurality of storage components, the another voltage being a voltage higher than the accessibility and retention voltages.

9. The method of claim 8, further comprising:
transitioning a fourth storage component of the plurality of storage components from the retention voltage to the accessibility voltage to enable the fourth storage component to be sequentially accessed after the first storage component.

10. The method of claim 9, further comprising:
transitioning the first storage component of the plurality of storage components from the accessibility voltage to the retention voltage, to enable the first storage component to receive the retention voltage after being accessed.

11. The method of claim 8 further comprising:
supplying the accessibility voltage to more than one of the plurality of storage components simultaneously to enable the buffered data to be received by the plurality of storage components.

12. The method of claim 8, wherein supplying the accessibility voltage comprises coupling the first storage component to a power rail via a coupling component, and supplying the retention voltage comprises coupling the second storage component to the power rail and decreasing voltage from the power rail via another coupling component.

13. The method of claim 8, wherein supplying the accessibility voltage comprises coupling the first storage component to a first power rail, and supplying the retention voltage comprises coupling the second storage component to a second power rail, the first power rail providing a voltage different than the second power rail.

14. A system comprising:
a processor;
a volatile system memory coupled to the processor;
an input/output (I/O) interface to output data from the system memory;
a first-in, first-out ("FIFO") buffer coupled to the I/O interface to buffer the output data, the FIFO buffer being divided into a plurality of FIFO buffer banks; and
a controller coupled to the FIFO buffer and configured to power a first FIFO buffer bank of the plurality of FIFO buffer banks with a first voltage to enable the first FIFO buffer bank to be accessed, power a second FIFO buffer bank of the plurality of FIFO buffer banks with a second voltage to enable the second FIFO buffer bank to retain the output data, and a third FIFO buffer bank of the plurality of FIFO buffer banks with a third voltage that is higher than the first voltage and the second voltage.

15. The system of claim 14, further comprising:
a power source to provide power to the plurality of FIFO buffer banks; and
a plurality of voltage regulators coupling the power source to the plurality of FIFO buffer banks, the plurality of voltage regulators to regulate voltage provided to a corresponding FIFO buffer bank.

16. The system of claim 14, further comprising:
one or more power rails coupled to the plurality of FIFO buffer banks to provide a selected power to one or more of the plurality of FIFO buffer banks.

17. The system of claim 16, wherein the one or more power rails comprise a first power rail to provide an access voltage to facilitate access to the FIFO buffer and a second power rail to provide a hold voltage to facilitate retention of data within the FIFO buffer.

* * * * *

UNITED STATES PATENT AND TRADEMARK OFFICE
CERTIFICATE OF CORRECTION

| | | |
|---|---|---|
| PATENT NO. | : 7,903,495 B2 | Page 1 of 1 |
| APPLICATION NO. | : 12/059640 | |
| DATED | : March 8, 2011 | |
| INVENTOR(S) | : Nikos Kaburlasos | |

It is certified that error appears in the above-identified patent and that said Letters Patent is hereby corrected as shown below:

Column 11

Line 24, "or the third voltage to of the first memory bank,..." should read --or the third voltage to the first memory bank,...--.

Signed and Sealed this
Fourteenth Day of August, 2012

David J. Kappos
*Director of the United States Patent and Trademark Office*